(12) United States Patent
Lee et al.

(10) Patent No.: US 8,263,970 B2
(45) Date of Patent: Sep. 11, 2012

(54) OPTICAL DEVICE HAVING SOLVATE AND MANUFACTURING METHOD THEREOF

(75) Inventors: Tu Lee, Flushing, NY (US); Shih-Chia Chang, Pingjhen (TW); Jen-Fan Peng, Miaoli County (TW)

(73) Assignee: National Central University (TW)

( * ) Notice: Subject to any disclaimer, the term of this patent is extended or adjusted under 35 U.S.C. 154(b) by 352 days.

(21) Appl. No.: 12/584,925

(22) Filed: Sep. 14, 2009

(65) Prior Publication Data
US 2010/0243996 A1   Sep. 30, 2010

(30) Foreign Application Priority Data

Mar. 27, 2009   (TW) ................................ 98110255 A

(51) Int. Cl.
*H01L 35/24* (2006.01)
(52) U.S. Cl. ................................ 257/40; 257/E51.001

(58) Field of Classification Search .................... 257/40, 257/E51.001
See application file for complete search history.

(56) References Cited

U.S. PATENT DOCUMENTS

2006/0246620 A1* 11/2006 Nagayama et al. ............. 438/99
2008/0308037 A1* 12/2008 Bulovic et al. ................. 118/302
* cited by examiner

*Primary Examiner* — Anthony Ho
(74) *Attorney, Agent, or Firm* — Hudak, Shunk & Farine

(57) ABSTRACT

The present invention discloses a manufacturing method for an optical device having a solvate, comprising the following steps: providing a substrate, depositing a solute on the substrate, and placing the substrate in the vapor environment of a solvent such that the solvent and the solute on the substrate form a solvate exhibiting optical properties. Furthermore, the present invention provides an optical device having a solvate, which modulates the photoluminescence (PL) intensity of the optical device via the solvate. The optical device is obtained by means of the above-described manufacturing method.

10 Claims, 9 Drawing Sheets

Solid powder is filled in the bottom of a long tube, which is then closely coupled to a stainless steel hollow carrier and is vertically placed into a thick Al plate having multiple holes, the interior of which is formed as a closed space. After a vacuum pump is connected to the top end of the carrier, the vacuum switch is turned on to maintain an evacuated state in the carrier — S31

The temperature of a heater is set to a specific value, and then the temperature at the bottom of the tube is measured and recorded by a thermocouple probe. Next, the tube is heated gradually to reach the sublimation point of the solid powder, and at this time, a substrate placed in the carrier faces downward such that gas molecules of the material deposit on the glass substrate to start film coating — S32

The material continuously sublimates such that a thin film begins to appear on the surface of the glass substrate, and the vapor deposition is performed for a period of about 30 minutes. Then the vacuum is released, and the film-coated substrate is taken out. Finally, a PL test is performed on the film-coated substrate — S33

A solvent is added into a vessel after the PL test and the film-deposited substrate is then put thereinto. After sealed, the vessel is put into an oven at 50°C lasting for several hours to allow sufficient contact between the solvent vapor and the film, and the solvent vapor molecules slowly evaporate and bring into contact with the film on the substrate. Subsequently, the glass substrate is taken out for a PL test — S34

FIG.3

OPTICAL DEVICE HAVING SOLVATE AND MANUFACTURING METHOD THEREOF

BACKGROUND OF THE INVENTION (a) Field of the Invention

The present invention relates to an optical device and manufacturing method thereof, and more particularly to an optical device which modulates the photoluminescence (PL) intensity of the optical device via a solvate and manufacturing method thereof.

(b) Description of the Prior Art

A solvate is formed by the combination of solvent molecules with solute ions or molecules such that the crystallized crystal changes in its structure and thus has different physical properties, such as solubility, boiling point, melting point, optical properties and the like. Formerly, most of those who noted differences in the optical properties are from the pharmaceutical industry. Moreover, conventional solvates are mostly obtained by crystallization due to temperature fluctuations. A solute is dissolved in a solvent at a high temperature, and then the solute in the solution slowly crystallizes out as the temperature of the supersaturated solution is gradually lowered. During crystallization, the solvent and solute molecules sequentially arrange themselves in an orderly manner to form a crystallized crystal, i.e. a solvate.

An OLED display is a display device that performs display by using the self-luminescent property of an organic luminescent material. It is mainly comprised of a pair of electrodes and an organic light-emitting layer. The organic light-emitting layer comprises a luminescent material. When an electrical current passes through the transparent anode and the metal cathode, electrons and holes recombine with each other in the luminescent material to generate excitons so that the luminescent material can emit light. However, there are still some problems that need to be overcome in organic electroluminescent devices, especially in the development of highly stable and efficient luminescent materials.

Furthermore, with the development of solar cells, today there are numerous types of solar cells, typically, for example, monocrystalline silicon solar cells, poly-crystalline silicon solar cells, amorphous silicon solar cells, compound solar cells, dye-sensitized solar cells and the like. In order to reduce the cost, the active development of amorphous silicon thin film solar cells at present is the major trend, but the efficiency is still too low in practical use.

SUMMARY OF THE INVENTION

In view of the above-described problems of the prior art, it is an object of the present invention to provide an optical device having a solvate and its manufacturing method. The optical device modulates the photoluminescence (PL) intensity of the optical device via the solvate so as to solve the problem of the development of luminescent materials for organic light-emitting diode devices and improve the efficiency of solar cells.

It is a further object of the present invention to provide a solvate prepared by a crystallization process, and it is found from the measurement of optical properties that the solvate has significant influence on the PL. Moreover, to extend its applications, organic semiconductor materials commonly used in the semiconductor industry are particularly vapor deposited on substrates resulting in film deposition, and the films are exposed to a solvent vapor which permits the formation of solvates. Accordingly, it is discovered that the influence of a solvate causes a significant change in the PL measurement so as to modulate the PL intensity via the solvate.

It is still a further object of the present invention to provide a manufacturing method for an optical device having a solvate, which comprises the steps of: providing a substrate, depositing a solute on the substrate, and placing the substrate in a vapor environment of a solvent such that the solvent and the solute on the substrate form a solvate exhibiting optical properties. The solute may be deposited on the substrate by a vapor deposition process. The temperature for the vapor environment of the solvent is 40-100° C. The selected substrate may be a transparent substrate, such as a glass substrate, a polymer substrate and the like. The solute may be an organic semiconductor material. Furthermore, the present invention provides an optical device having a solvate, which is obtained by means of the above-described manufacturing method. The optical device having a solvate may be an organic light-emitting diode or a solar cell. Moreover, the organic light-emitting diode and the solar cell comprise an organic light-emitting layer and a photosensitizer layer, respectively, and the solvate is formed thereon.

Another object of the present invention is to provide an optical device having a solvate, comprising a substrate and a solvate disposed on the substrate. The solvate is prepared from an organic semiconductor material and an organic solvent, and exhibits optical properties. The substrate used may be a transparent substrate, such as a glass substrate, a polymer substrate, etc. The optical device having a solvate may be an organic light-emitting diode or a solar cell. The organic light-emitting diode further comprises an organic light-emitting layer. The solvate may be deposited on the organic light-emitting layer or doped thereinto. Moreover, the solar cell may further comprise a photosensitizer layer, and the solvate may be deposited on the photosensitizer layer or doped thereinto.

As stated above, the present invention may have one or more of the following advantages:

(1) In the present invention, the differences of solvates are examined from the viewpoint of optical properties and the concept of a solvate is introduced and will be a factor considered in manufacturing devices. Almost no prior art is directed to the influence of a solvate on the optical properties. Formerly, most of those who noted this subject are from the pharmaceutical industry, so it is a new attempt to introduce this concept to the device and semiconductor industries.

(2) Conventional organic solvates are mostly obtained by crystallization due to temperature fluctuations. The present invention utilizes this concept to change the formation mechanism. Solute molecules are vapor deposited on a substrate and then exposed to an organic solvent vapor to obtain an organic solvate. Therefore, this method can be advantageously applied to thin-film elements.

(3) The present invention utilizes the concept that an organic solvate change the optical properties of the organic compound. Optimization and control of the properties can be used to achieve an expected purpose whether in the optoelectronic or semiconductor industry, or even in the organic solar cell field. This breaks through the limitation that it is eager to seek or develop new materials while the problem of demand for new materials occurs. Also, the properties of materials can be altered by different manufacturing techniques so as to achieve a desired purpose.

(4) The luminous intensity of a light-emitting diode can be modulated according to the present invention.

(5) The concept of the present invention together with a solvate allows for an increase in the light absorption intensity of a solar cell.

BRIEF DESCRIPTION OF THE DRAWINGS

FIG. 3 is a flow chart of a preferred embodiment of a manufacturing method for an optical device having a solvate according to the present invention;

DETAILED DESCRIPTION OF THE PREFERRED EMBODIMENTS

Figure 1:
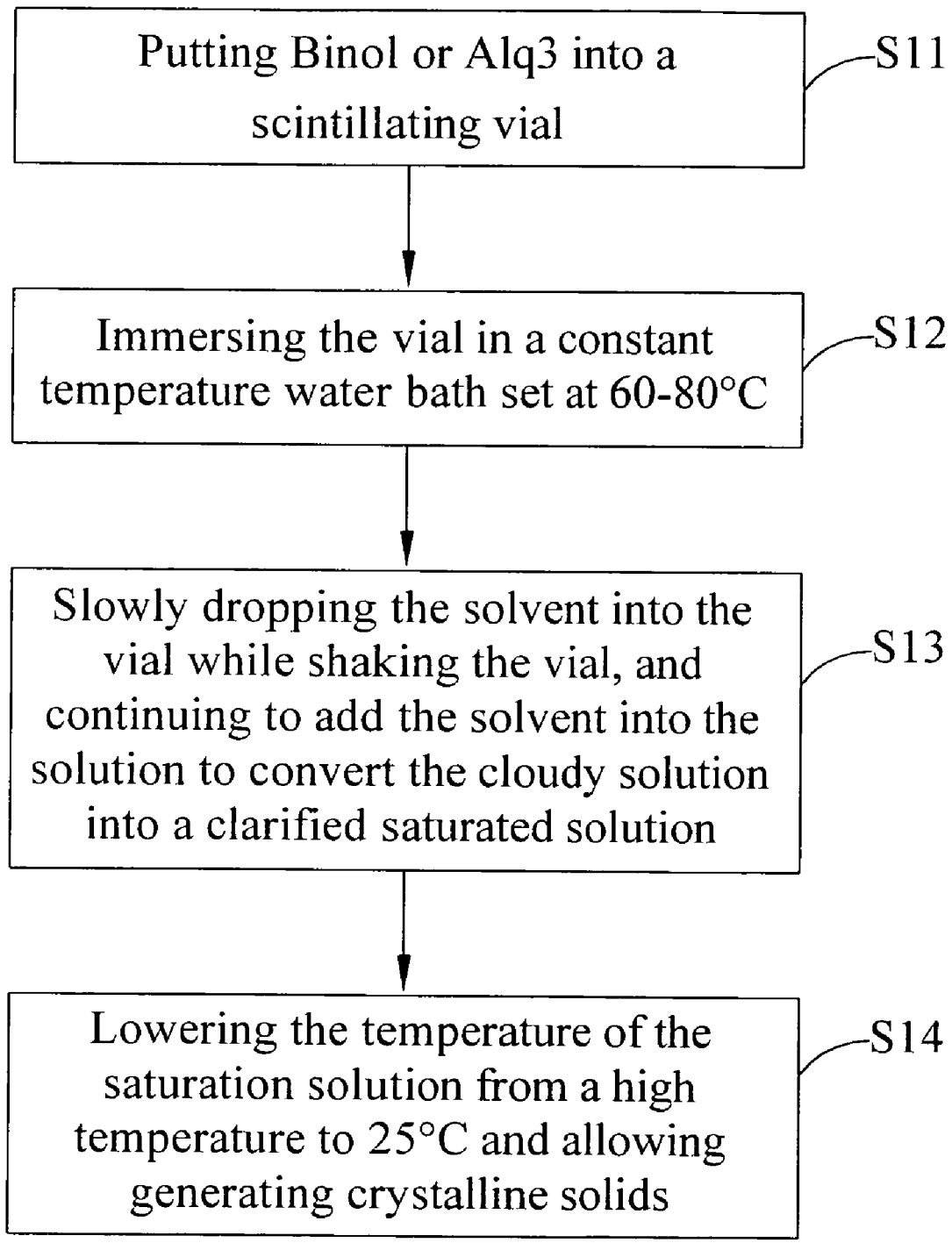
FIG. 1 is a schematic view of a preferred embodiment of the preparation of a solvate by a crystallization process according to the present invention.
Figure 2A:
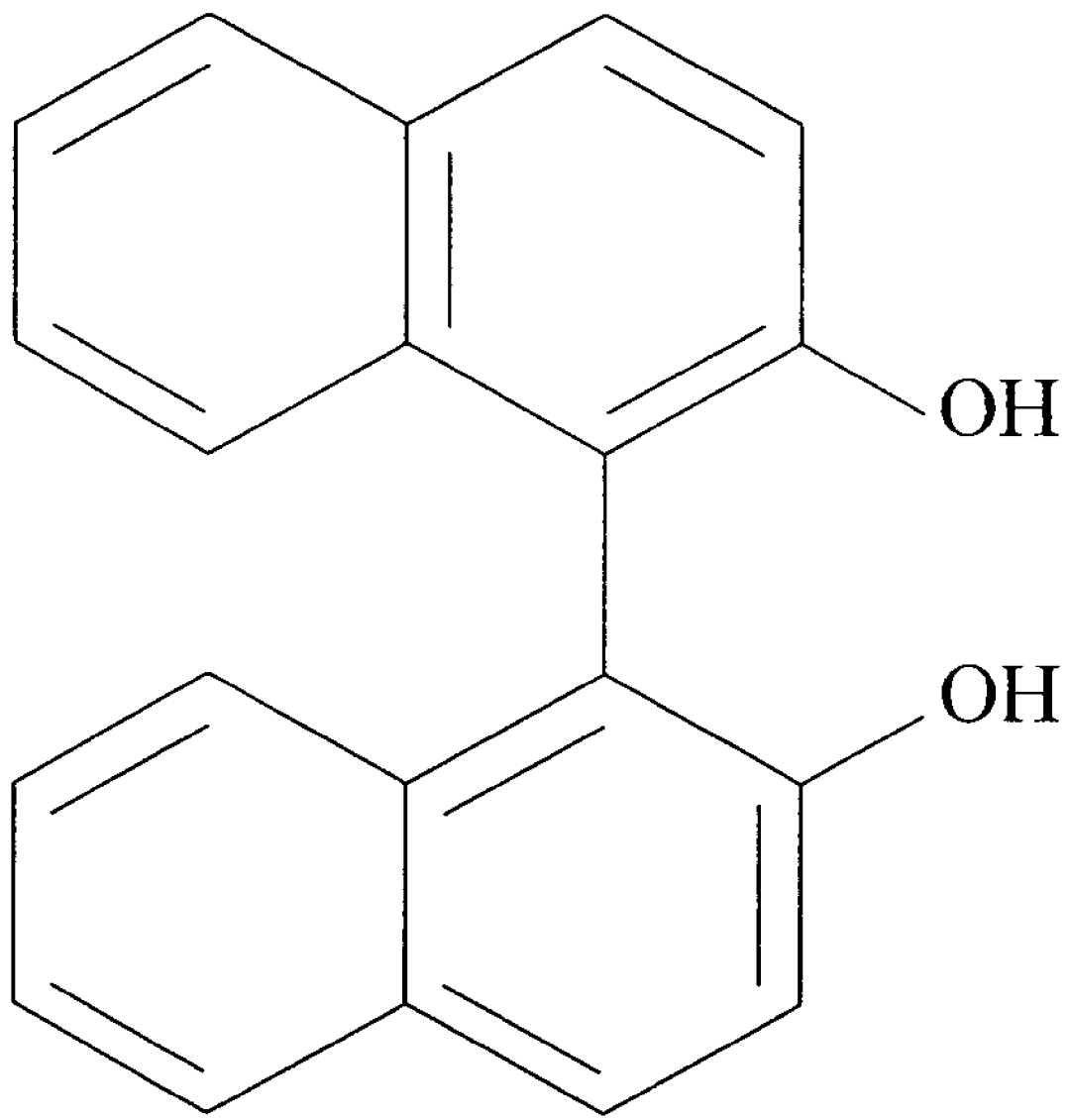
FIG. 2A is a diagram showing a molecular structure of 1,1-bi-2-naphthol.
Figure 2B:
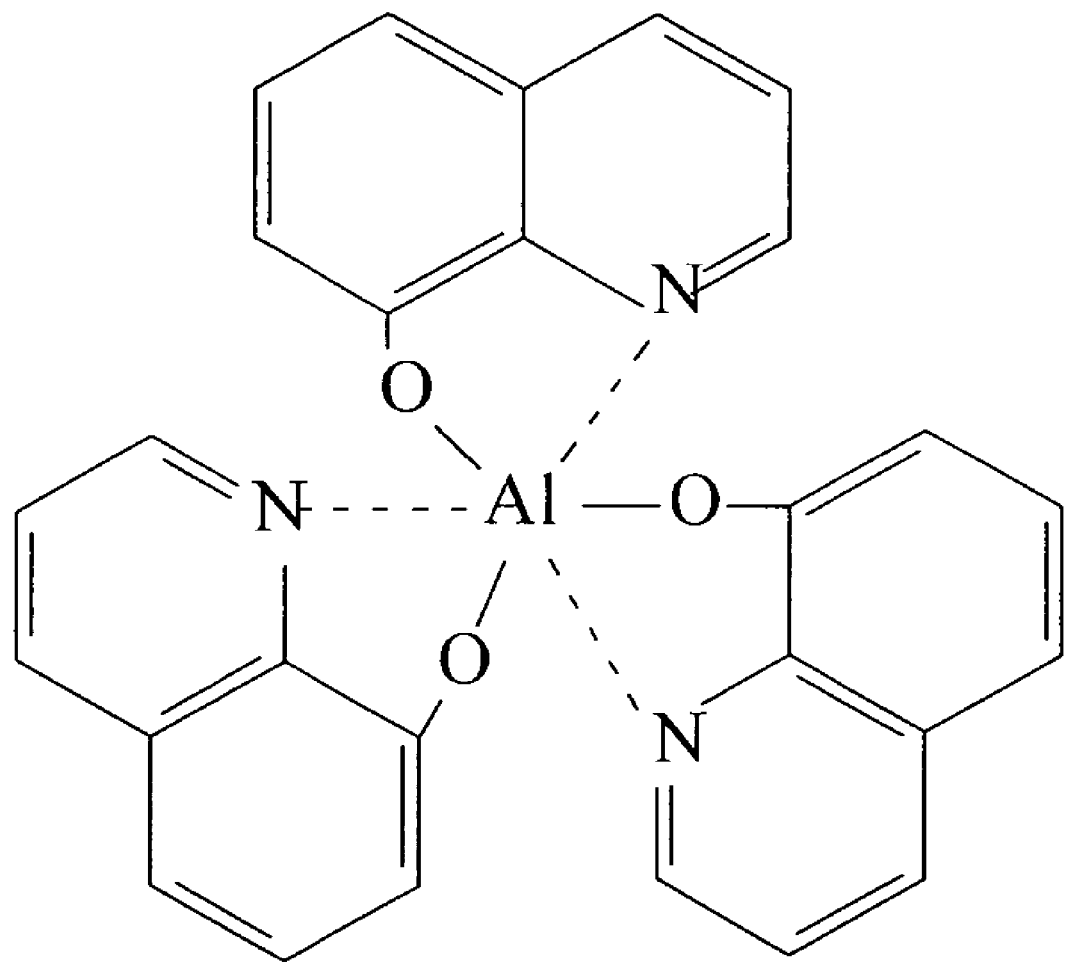
FIG. 2B is a diagram showing a molecular structure of tris-(8-hydroxyquinoline) aluminum(III)

Referring to FIG. 1, a flow chart of a preferred embodiment of the preparation of a solvate by a crystallization process according to the present invention is shown. The steps are as follows: step S11, putting 1,1-bi-2-naphthol (Binol, as shown in FIG. 2A) or tris-(8-hydroxyquinoline) aluminum(III) (Alq3, as shown in FIG. 2B) into a scintillating vial; step S12, immersing the vial in a constant temperature water bath set at 60-80° C.; step S13, slowly dropping the solvent into the vial using a micropipetter while shaking the vial to allow for homogeneous mixing of the solution, continuing to add the solvent into the solution to convert the cloudy solution into a clarified saturated solution; and step S14, lowering the temperature of the saturation solution from a high temperature to 25° C. and allowing generating crystalline solids due to the phenomenon that a high-temperature saturated solution would be supersaturated at a low temperature. In addition, the measurements which are performed on the resulted crystalline solid by using a thermogravimetric analyzer, a Fourier transform infrared spectrometer and powder X-ray diffraction to prove that the solvates do indeed exist. Next, in order to observe changes in the optical properties, a fluorescence spectrometer is used to measure the photoluminescence (PL) intensity and it is observed that the solvates cause significant changes in the PL intensity. For Binol, the solvates obtained from the solvents, dimethyl sulfoxide (DMSO) and N,N-dimethyl formamide (DMF) allow for an approximately 2-3 times increase in the PL intensity (as shown in Table 1); whereas the solvates obtained from Alq3 in DMF, nitrobenzene, chloroform or 1,4-dioxane reduce the PL intensity (as shown in Table 2).

TABLE 1

| | Excitation wavelength (nm) | Emission wavelength (nm) | PL intensity (a.u.) |
| --- | --- | --- | --- |
| Binol powder | 290 | 360 | 176 |
| Binol which crystallizes in DMSO | 290 | 376 | 315 |
| Binol which crystallizes in DMF | 290 | 375 | 510 |

TABLE 2

| | Excitation wavelength (nm) | Emission wavelength (nm) | PL intensity (a.u.) |
| --- | --- | --- | --- |
| Alq3 powder | 380 | 503 | 767 |
| Alq3 which crystallizes in DMF | 380 | 503 | 501 |
| Alq3 which crystallizes in nitrobenzene | 380 | 503 | 597 |
| Alq3 which crystallizes in chloroform | 380 | 503 | 63 |
| Alq3 which crystallizes in 1,4-dioxane | 380 | 503 | 565 |

Figure 4:
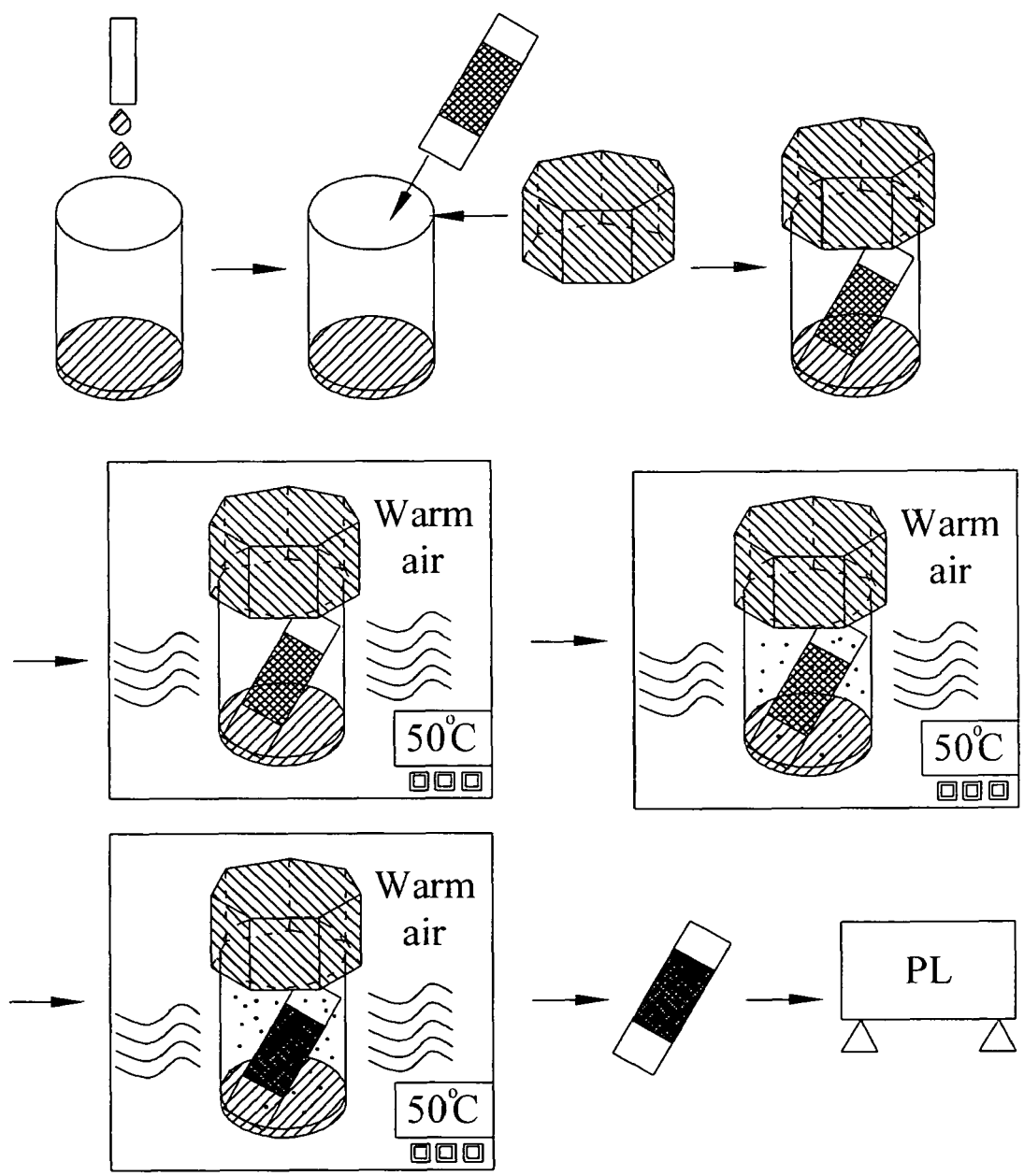
FIG. 4 is a schematic view showing a process of step S34 in FIG. 3.

Referring to FIG. 3, a flow chart of a preferred embodiment of the preparation of a solvate by a crystallization process according to the present invention is shown. The preparation process is as follows. In step S31, the solid powder of an organic semiconductor material, Binol or Alq3, is filled in the bottom of a long tube. The long tube is then closely coupled to a stainless steel hollow carrier and is vertically placed into a thick aluminium plate having multiple holes, the interior of which is formed as a closed space. After a vacuum pump is connected to the top end of the carrier, the vacuum switch is turned on to maintain an evacuated state in the carrier. In step S32, the temperature of a heater is set to a specific value, and then the temperature at the bottom of the tube is measured and recorded by a thermocouple probe. Next, the tube is heated gradually to reach the sublimation point of Binol or Alq3, and at this time, a glass substrate placed in the carrier faces downward such that gas molecules of Binol or Alq3 deposit on the glass substrate to start film coating. In step S33, Binol or Alq3 continuously sublimates to gas such that a thin film begins to appear on the surface of the glass substrate, and the vapor deposition is performed for a period of about 30 minutes. Then the vacuum is released, and the film-coated glass substrate is taken out. Finally, a PL test is performed on the film-coated glass substrate. And in step S34, as shown in FIG. 4, a solvent is added into a vessel and the film-deposited glass substrate is then put thereinto. After sealed, the vessel is put into an oven at 50° C. lasting for several hours to allow sufficient contact between the solvent vapor and the film, and the solvent vapor molecules slowly evaporate and bring into contact with the film on the glass substrate resulting in the formation of a solvate so as to change its optical properties. Subsequently, the glass substrate is taken out for a PL test. Binol films are exposed to DMSO or DMF vapor, and Alq3 films are exposed to DMF, nitrobenzene, chloroform or 1,4-dioxane vapor. Comparing the PL spectra of the films exposed to the vapor with that of the unexposed films, it is discovered that the PL intensity of the films exposed to the vapor has changed, following the same trend as the solvates obtained by crystallization due to temperature fluctuations. In regard to the PL intensity of Binol films, the intensity of the vapor-treated films is approximately 5-10 times higher than that of the untreated films (as shown in Table 3). In regard to the PL intensity of Alq3 films, the intensity of the vapor-treated films is approximately ⅓-⅔ time that of the untreated films (as shown in Table 4).

TABLE 3

| | Excitation wavelength (nm) | Emission wavelength (nm) | PL intensity (a.u.) |
|---|---|---|---|
| Binol film | 290 | 360 | 11 |
| Binol film in DMSO vapor | 290 | 376 | 155 |
| Binol film in DMF vapor | 290 | 375 | 65 |

TABLE 4

| | Excitation wavelength (nm) | Emission wavelength (nm) | PL intensity (a.u.) |
|---|---|---|---|
| Alq3 film | 380 | 503 | 323 |
| Alq3 film in DMF vapor | 380 | 503 | 153 |
| Alq3 film in nitrobenzene vapor | 380 | 503 | 228 |
| Alq3 film in chloroform vapor | 380 | 503 | 109 |
| Alq3 film in 1,4-dioxane vapor | 380 | 503 | 194 |

Figure 5:
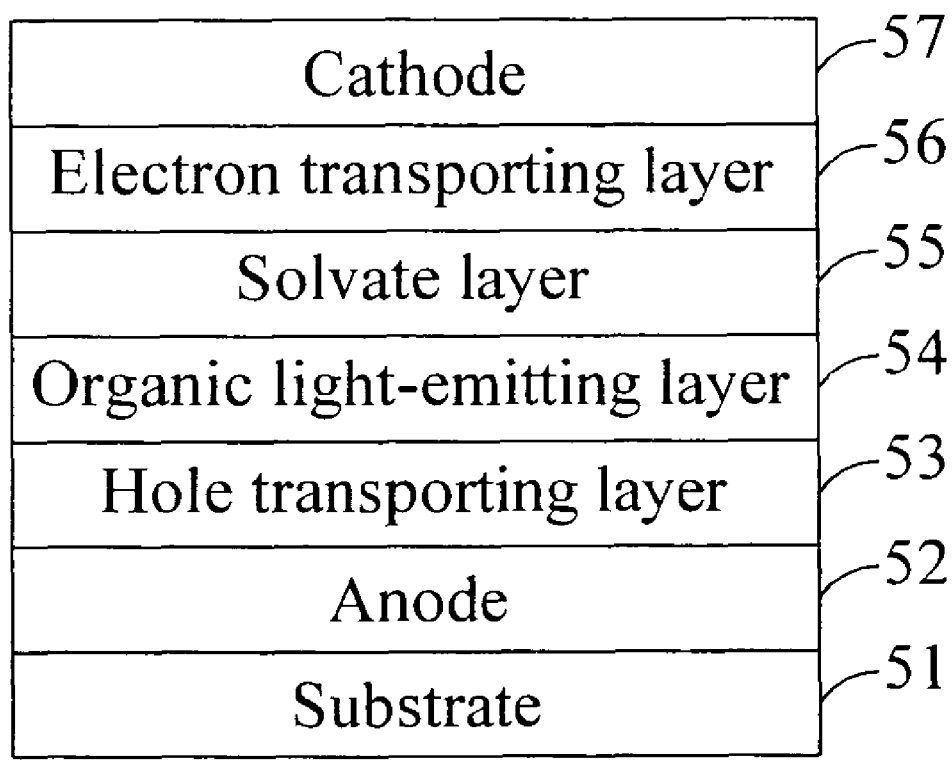
FIG. 5 is a schematic view showing a structure of a first embodiment of an optical device having a solvate according to the present invention.

Referring to FIG. 5, a schematic view showing a structure of a first embodiment of an optical device having a solvate according to the present invention is shown. In this figure, the optical device having a solvate is an organic light-emitting diode 5, and it sequentially comprises, from bottom to top, a transparent substrate 51, a transparent anode 52, a hole transporting layer 53, an organic light-emitting layer 54, a solvate layer 55, an electron transporting layer 56 and a metal cathode 57. The solvate layer 55 is vapor deposited on the organic light-emitting layer 54 by means of the above-described method. The solvate layer 55 is formed from Binol and DMSO or DMF, or from Alq3 and DMF, nitrobenzene, chloroform or 1,4-dioxane.

Figure 6:
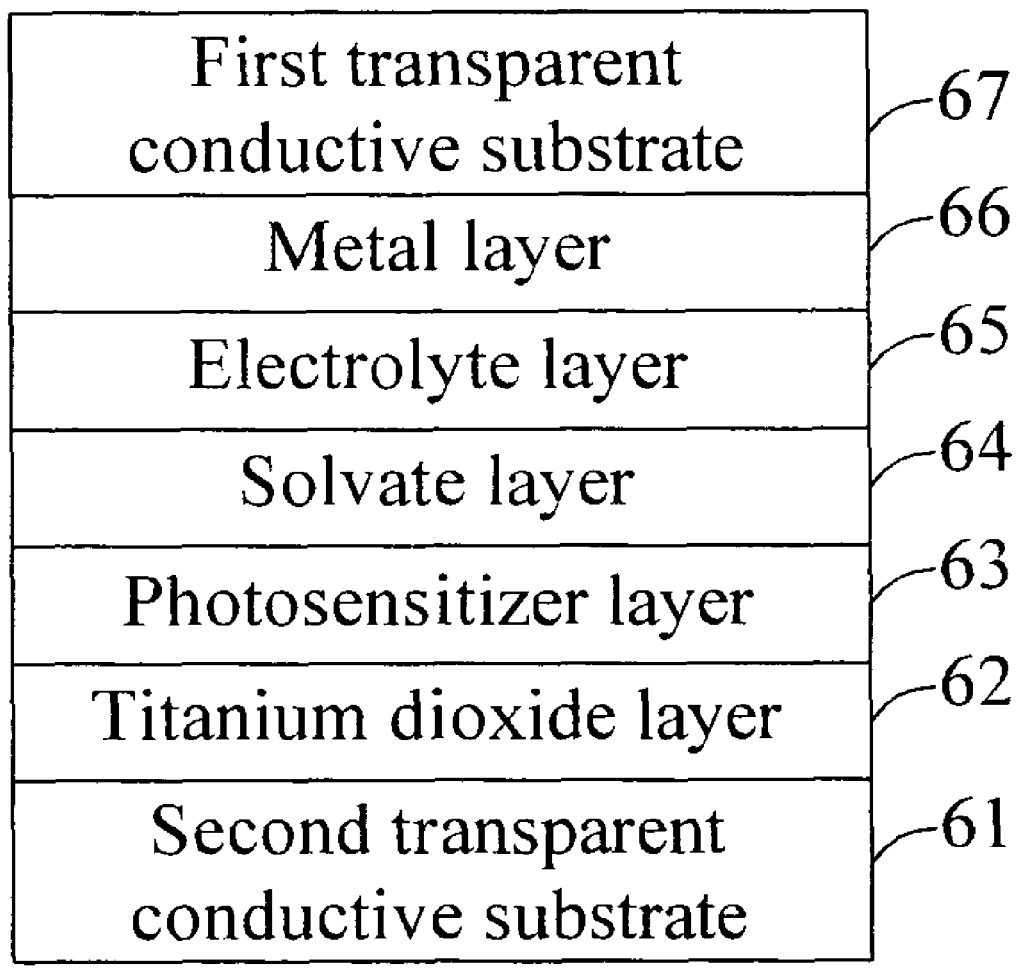
FIG. 6 is a schematic view showing a structure of a second embodiment of an optical device having a solvate according to the present invention.

Referring to FIG. 6, a schematic view showing a structure of a second embodiment of an optical device having a solvate according to the present invention is shown. In this figure, the optical device having a solvate is a solar cell 6, and it sequentially comprises, from bottom to top, a second transparent conductive substrate 61, a titanium dioxide layer 62, a photosensitizer layer 63, a solvate layer 64, an electrolyte layer 65, a metal layer 66 and a first transparent conductive substrate 67. The solvate layer 64 is vapor deposited on the photosensitizer layer 63 by means of the above-described method. The solvate layer 64 is formed from Binol and DMSO or DMF, or from Alq3 and DMF, nitrobenzene, chloroform or 1,4-dioxane.

Figure 7:
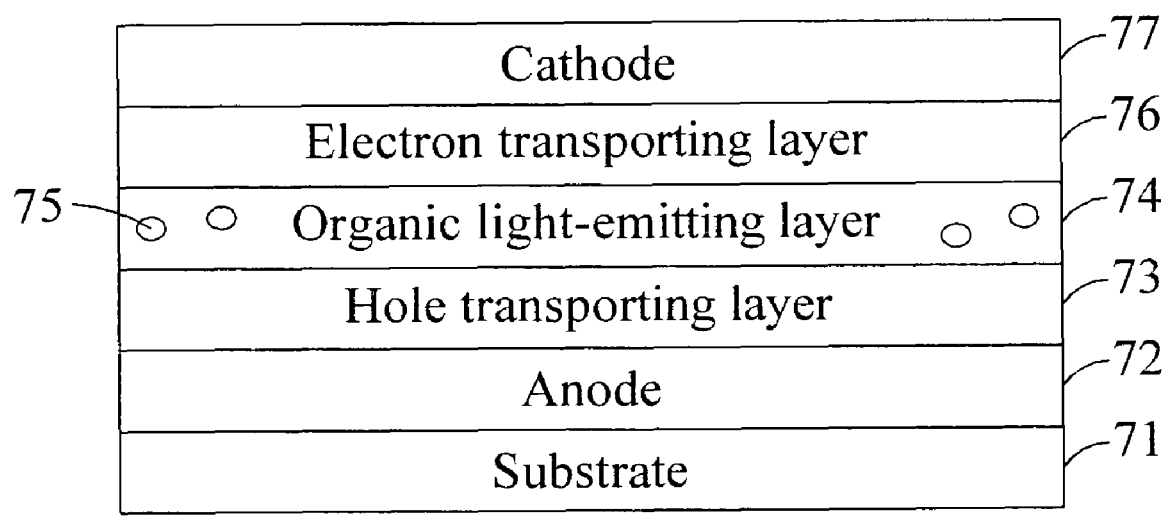
FIG. 7 is a schematic view showing a structure of a third embodiment of an optical device having a solvate according to the present invention.

Referring to FIG. 7, a schematic view showing a structure of a third embodiment of an optical device having a solvate according to the present invention is shown. In this figure, the optical device having a solvate is an organic light-emitting diode 7, and it sequentially comprises, from bottom to top, a transparent substrate 71, a transparent anode 72, a hole transporting layer 73, an organic light-emitting layer 74, an electron transporting layer 76 and a metal cathode 77. The organic light-emitting layer 74 is a single-layer or multi-layer structure formed from a fluorescent luminescent material, a phosphorescent luminescent material or a combination thereof, further having a solvate 75 doped thereinto or coated thereon. Moreover, the solvate is prepared from an organic semiconductor material and an organic solvent, and exhibits optical properties.

Figure 8:
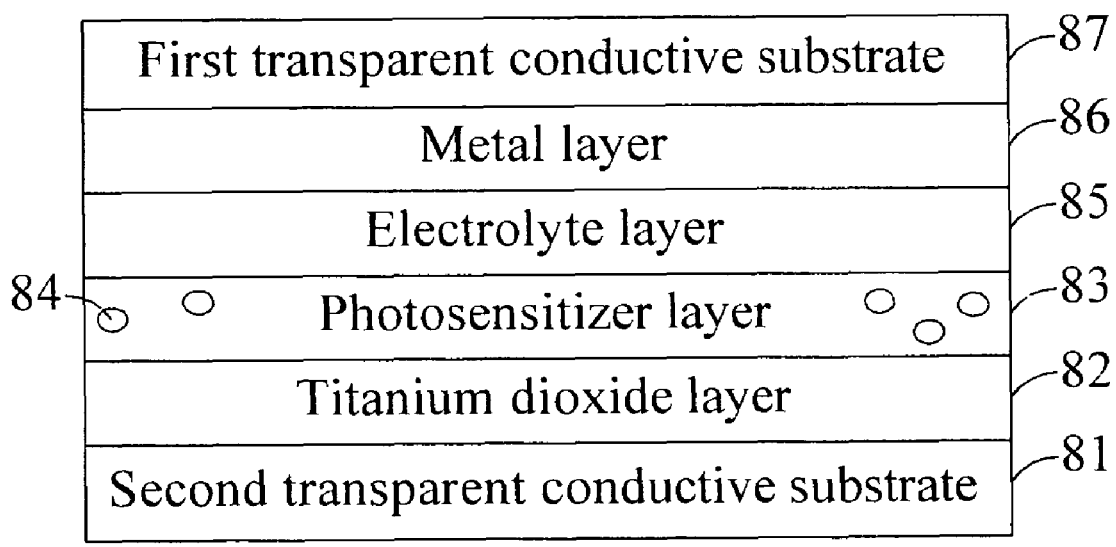
FIG. 8 is a schematic view showing a structure of a fourth embodiment of an optical device having a solvate according to the present invention.

Referring to FIG. 8, a schematic view showing a structure of a fourth embodiment of an optical device having a solvate according to the present invention is shown. In this figure, the optical device having a solvate is a solar cell 8, and it sequentially comprises, from bottom to top, a second transparent conductive substrate 81, a titanium dioxide layer 82, a photosensitizer layer 83, an electrolyte layer 85, a metal layer 86 and a first transparent conductive substrate 87. The photosensitizer layer 83 further has the solvate 84 doped thereinto or deposited thereon. Moreover, the solvate is prepared from an organic semiconductor material and an organic solvent, and exhibits optical properties.

The above description is illustrative only and is not to be considered limiting. Various modifications or changes can be made without departing from the spirit and scope of the invention. All such equivalent modifications and changes shall be comprised within the scope of the appended claims.

What is claimed is:

1. An optical device having a solvate, comprising:
   a substrate; and
   a solvate disposed on the substrate, wherein the solvate: is prepared from an organic semiconductor material and an organic solvent, and exhibits optical properties;
   wherein the optical device is an organic light-emitting diode that further comprises an organic light-emitting layer disposed on the substrate;
   wherein the solvate is deposited on the organic light-emitting layer or doped into the organic light-emitting layer.

2. The optical device having a solvate according to claim 1, wherein the substrate comprises a glass substrate or a polymer substrate.

3. The optical device having a solvate according to claim 1, wherein the organic semiconductor material comprises 1,1-bi-2-naphthol (Binol) or tris-(8-hydroxy quinoline) aluminum(III) (Alq3).

4. The optical device having a solvate according to claim 1, wherein the organic solvent comprises dimethyl sulfoxide (DMSO), N,N-dimethylformamide (DMF), nitrobenzene, chloroform or 1,4-dioxane.

5. The optical device having a solvate, according to claim 1, wherein the organic light-emitting layer comprises a single-layer or multi-layer structure formed from a fluorescent luminescent material, a phosphorescent luminescent material or a combination thereof.

6. An optical device having a solvate, comprising:
   a substrate; and
   a solvate disposed on the substrate, wherein the solvate is prepared from an organic semiconductor material and an organic solvent, and exhibits optical properties;
   wherein the optical device is a solar cell;
   wherein the solar cell further comprises a photosensitizer layer disposed on the substrate.

7. The optical device having a solvate according to claim 6, wherein the substrate comprises a glass substrate or a polymer substrate.

8. The optical device having a solvate according to claim 6, wherein the organic semiconductor material comprises 1,1- bi-2-naphthol (Binol) or tris-(8-hydroxy quinoline) aluminum(III) (Alq3).

9. The optical device having a solvate according to claim 6, wherein the organic solvent comprises dimethyl sulfoxide (DMSO), N,N-dimethylformamide (DMF), nitrobenzene, chloroform or 1,4-dioxane.

10. The optical device having a solvate according to claim 6, wherein the solvate is deposited on the photosensitizer layer or doped into the photosensitizer layer.

* * * * *